United States Patent
Kaneko

(10) Patent No.: US 12,534,825 B2
(45) Date of Patent: Jan. 27, 2026

(54) SIC EPITAXIAL SUBSTRATE MANUFACTURING METHOD AND MANUFACTURING DEVICE THEREFOR

(71) Applicants: KWANSEI GAKUIN EDUCATIONAL FOUNDATION, Hyogo (JP); TOYOTA TSUSHO CORPORATION, Nagoya (JP)

(72) Inventor: Tadaaki Kaneko, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 189 days.

(21) Appl. No.: 17/436,302

(22) PCT Filed: Mar. 3, 2020

(86) PCT No.: PCT/JP2020/008967
§ 371 (c)(1),
(2) Date: Sep. 3, 2021

(87) PCT Pub. No.: WO2020/179796
PCT Pub. Date: Sep. 10, 2020

(65) Prior Publication Data
US 2022/0181156 A1    Jun. 9, 2022

(30) Foreign Application Priority Data

Mar. 5, 2019 (JP) .................................. 2019-040072
Mar. 29, 2019 (JP) .................................. 2019-069280
Mar. 29, 2019 (JP) .................................. 2019-069281

(51) Int. Cl.
*C30B 29/36* (2006.01)
*C23C 14/06* (2006.01)
(Continued)

(52) U.S. Cl.
CPC .......... *C30B 29/36* (2013.01); *C23C 14/0635* (2013.01); *C23C 14/5873* (2013.01);
(Continued)

(58) Field of Classification Search
CPC ..... C30B 29/36; C30B 23/06; C23C 14/0635; H01L 21/02378; H01L 21/02529; H01L 21/02631; H01L 21/046
See application file for complete search history.

(56) References Cited

U.S. PATENT DOCUMENTS 7,052,546 B1    5/2006  Motakef et al.
2006/0144324 A1    7/2006  Sakaguchi et al.
(Continued)

FOREIGN PATENT DOCUMENTS

CN    103422174 A  * 12/2013 ............. C30B 23/00
CN    105308223 A  *  2/2016 ............. C01B 31/36
(Continued)

OTHER PUBLICATIONS

Hens et al., "P- and n-type doping in SiC sublimation epitaxy using highly doped substrates", Materials Science Forum, 615-617, p. 85-88 (Year: 2009).*
(Continued)

*Primary Examiner* — Jay C Kim
*Assistant Examiner* — Woo K Lee
(74) *Attorney, Agent, or Firm* — Calfee, Halter & Griswold LLP

(57) ABSTRACT

The present invention addresses the problem of providing a novel SiC epitaxial substrate manufacturing method and manufacturing device therefor. An SiC substrate and an SiC material, which has a lower doping concentration than said SiC substrate, are heated facing one another, and material is transported from the SiC material to the SiC substrate to form an SiC epitaxial layer. As a result, in comparison with
(Continued)

the existing method (chemical vapour deposition), it is possible to provide an SiC epitaxial substrate manufacturing method with a reduced number of parameters to be controlled.

6 Claims, 7 Drawing Sheets

(51) Int. Cl.
| | |
|---|---|
| C23C 14/58 | (2006.01) |
| C30B 23/06 | (2006.01) |
| C30B 33/08 | (2006.01) |
| H01L 21/02 | (2006.01) |
| H01L 21/04 | (2006.01) |

(52) U.S. Cl.
CPC .............. *C30B 23/06* (2013.01); *C30B 33/08* (2013.01); *H01L 21/02378* (2013.01); *H01L 21/02433* (2013.01); *H01L 21/02529* (2013.01); *H01L 21/02573* (2013.01); *H01L 21/02631* (2013.01); *H01L 21/046* (2013.01)

(56) References Cited

U.S. PATENT DOCUMENTS

| | | | | |
|---|---|---|---|---|
| 2012/0025153 | A1* | 2/2012 | Hirose | C30B 29/36 252/516 |
| 2014/0220325 | A1 | 8/2014 | Loboda | |
| 2015/0159299 | A1* | 6/2015 | Shinya | C30B 11/08 117/35 |
| 2016/0312381 | A1* | 10/2016 | Norimatsu | C30B 25/20 |
| 2017/0321345 | A1* | 11/2017 | Xu | C30B 29/36 |
| 2017/0323797 | A1 | 11/2017 | Torimi et al. | |
| 2019/0136409 | A1* | 5/2019 | Kaneko | H01L 21/02631 |
| 2019/0376206 | A1 | 12/2019 | Fukada et al. | |

FOREIGN PATENT DOCUMENTS

| | | | |
|---|---|---|---|
| CN | 106894091 | A | 6/2017 |
| EP | 3382067 | A1 | 10/2018 |
| EP | 3879011 | A1 | 9/2021 |
| JP | 2003104799 | A | 4/2003 |
| JP | 2004091228 | A * | 3/2004 |
| JP | 2004-131376 | A | 4/2004 |
| JP | 2008074664 | A | 4/2008 |
| JP | 2014047090 | A | 3/2014 |
| JP | 2017065996 | A | 4/2017 |
| JP | 2018-113303 | A | 7/2018 |
| TW | 201630061 | A | 8/2016 |
| WO | 2017188381 | A1 | 11/2017 |

OTHER PUBLICATIONS

Hens et al., "P- and n-type doping in SiC sublimation epitaxy using highly doped substrates", Materials Science Forum, 615-617, p. 85-88, 2009 (Year: 2009).*
English translation of Office Action from Chinese Application No. 202080018795.2 dated Apr. 8, 2023.
EPO Communication and European Search Report issued in EP application No. 20765997.0 dated Nov. 11, 2022.
Communication from European Application No. 23153067.6 dated May 30, 2023.
Syvajarvi, J. et al. "Comparison of SiC sublimation epitaxial growth in graphite and TaC coated crucibles", Diamond and Related Materials 12, pp. 1936-1939 (2003).
International Search Report from PCT/JP2020/008967 dated Jun. 2, 2020 (4 pages).

* cited by examiner (a)

(b)

(c)

(d)

(a)

(b)

(a)

(b)

SIC EPITAXIAL SUBSTRATE MANUFACTURING METHOD AND MANUFACTURING DEVICE THEREFOR

CROSS-REFERENCE TO RELATED APPLICATIONS

This application is a 371 of PCT Application No. PCT/JP2020/008967 filed on Mar. 3, 2020, which claims priority to Japanese Application No. 2019-040072, filed on Mar. 5, 2019, Japanese Application No. 2019-069280, filed on Mar. 29, 2019, and Japanese Application No. 2019-069281, filed on Mar. 29, 2019, the contents of which are hereby incorporated by reference as if recited in their entirety.

TECHNICAL FIELD

The present invention relates to a method and a device for manufacturing a SiC epitaxial substrate.

BACKGROUND ART

In recent years, silicon carbide (SiC) semiconductor devices have attracted attention as high-performance semiconductor devices because they have higher withstand voltage and higher efficiency than those of silicon (Si) and gallium arsenide (GaAs) semiconductor devices and can operate at higher temperatures.

In general, a SiC semiconductor device is manufactured using a SiC epitaxial substrate in which a SiC epitaxial layer serving as an active region of the device is grown on a SiC single crystal substrate. This SiC epitaxial layer is generally formed by chemical vapor deposition (CVD) (see, for example, Patent Literature 1).

The chemical vapor deposition method is a method in which a source gas is thermally decomposed in a carrier gas, and silicon (Si) atoms and carbon (C) atoms are continuously deposited on a SiC single crystal substrate to form a SiC epitaxial layer. In general, a monosilane ($SiH_4$) gas and a dimethylmethane ($C_3H_8$) gas are used as source gases, and a hydrogen ($H_2$) gas is used as a carrier gas.

In the chemical vapor deposition method, a dopant gas is appropriately added in addition to the source gases and the carrier gas. By controlling the flow rate of the dopant gas, a SiC epitaxial layer having a doping concentration suitable for the withstand voltage layer of the semiconductor device is formed. Examples of the dopant to be doped can include nitrogen (N), phosphorus (P), aluminum (Al), and boron (B).

CITATION LIST

Patent Literature

Patent Literature 1: JP 2014-47090 A

SUMMARY OF INVENTION

Technical Problem

However, in the chemical vapor deposition method, since the source gas, the carrier gas, and the dopant gas are mixed in the growth environment of the SiC single crystal substrate, there is a problem that it is difficult to control the growth environment. In particular, it is necessary to optimize a plurality of parameters such as the flow rate of each gas and the heating temperature of the SiC single crystal substrate.

An object of the present invention is to provide a novel method and a device for manufacturing a SiC epitaxial substrate.

Solution to Problem

The present invention to solve the above problem is a method for manufacturing a SiC epitaxial substrate, the method including: heating a SiC substrate and a SiC material having a doping concentration lower than that of the SiC substrate in a manner that the SiC substrate and the SiC material face each other; and transporting a raw material from the SiC material to the SiC substrate to form a SiC epitaxial layer.

As described above, by growing the SiC substrate and the SiC material having a doping concentration lower than that of the SiC substrate in a manner that the SiC substrate and the SiC material face each other, it is possible to reduce parameters to be controlled as compared with the conventional method (chemical vapor deposition method). Further, by selecting a SiC material having a desired doping concentration, the doping concentration of the SiC epitaxial layer can be controlled.

In a preferred embodiment of the present invention, the doping concentration of the SiC material is equal to or lower than $1 \times 10^{17}$ $cm^{-3}$.

By using the SiC material having such a doping concentration, a SiC epitaxial layer having a doping concentration suitable for the withstand voltage layer can be formed.

In a preferred embodiment of the present invention, heating is performed so as to form a raw material transport space having a temperature gradient between the SiC substrate and the SiC material, and the SiC material is arranged on a high temperature side and the SiC substrate is arranged on a low temperature side to transport the raw material.

As described above, by providing the temperature gradient between the SiC substrate and the SiC material, the raw material can be easily transported.

In a preferred embodiment of the present invention, the SiC substrate is arranged and heated in a semi-closed space in which the atomic number ratio Si/C is equal to or lower than 1, thereby reducing the basal plane dislocation density in the SiC epitaxial layer.

As described above, by arranging and heating the SiC substrate in the semi-closed space in which the atomic number ratio Si/C is equal to or lower than 1, a SiC epitaxial layer in which the basal plane dislocation density is reduced can be formed.

In a preferred embodiment of the present invention, the SiC substrate is arranged and heated in a semi-closed space in which an atomic number ratio Si/C is higher than 1 to planarize the surface of the SiC epitaxial layer.

As described above, by arranging and heating the SiC substrate in the semi-closed space in which the atomic number ratio Si/C is higher than 1, the SiC epitaxial layer having the surface in which the macro-step bunching is decomposed can be formed.

In a preferred embodiment of the present invention, the SiC substrate is arranged and heated in a semi-closed space in which the atomic number ratio Si/C is equal to or lower than 1, and then arranged and heated in a semi-closed space in which the atomic number ratio Si/C is higher than 1, thereby reducing the basal plane dislocation density in the SiC epitaxial layer.

As described above, by arranging and heating the SiC epitaxial substrate in the semi-closed space in which the atomic number ratio Si/C is equal to or lower than 1, and then arranging and heating the SiC epitaxial substrate in the semi-closed space in which the atomic number ratio Si/C is higher than 1, the SiC epitaxial layer in which the basal plane dislocation density is reduced can be formed.

In a preferred embodiment of the present invention, the SiC substrate is heated in a temperature range of equal to or higher than 1600° C.

By heating in such a temperature range, the SiC epitaxial layer can be formed at high speed.

In a preferred embodiment of the present invention, a SiC epitaxial layer having a basal plane dislocation density of equal to or lower than 1.0 piece $cm^{-2}$ at a surface is formed.

The present invention also relates to a device for manufacturing a SiC epitaxial substrate. That is, the present invention to solve the above problem is a device for manufacturing a SiC epitaxial substrate including a main container capable of accommodating a SiC substrate, in which the main container includes a substrate installation portion on which the SiC substrate is installed and a SiC material facing the substrate installation portion, and the SiC material has a doping concentration lower than that of the SiC substrate.

In a preferred embodiment of the present invention, the main container is made of the SiC material.

As described above, by configuring the main container itself with the SiC material, it is possible to use the main container to serve as a source of a raw material while forming a semi-closed space.

Further, the present invention to solve the above problem is a device for manufacturing a SiC epitaxial substrate including a main container capable of accommodating a SiC substrate, in which the main container includes a substrate installation portion on which the SiC substrate is installed, and a SiC material installation portion on which a SiC material is installed on a position facing the substrate installation portion, and the SiC material has a doping concentration lower than that of the SiC substrate.

As described above, by providing the SiC material installation portion on which the SiC material is installed, the main container can be made of any material.

In a preferred embodiment of the present invention, the doping concentration of the SiC material is equal to or lower than $1 \times 10^{17}$ $cm^{-3}$.

In a preferred embodiment of the present invention, the main container includes a support provided between the SiC substrate and the SiC material.

In a preferred embodiment of the present invention, a heating furnace that performs heating so that a temperature gradient is formed between the SiC substrate and the SiC material is further provided.

In a preferred embodiment of the present invention, the heating furnace includes a high melting point container capable of accommodating the main container, and a Si vapor supply source capable of supplying Si vapor into the high melting point container.

In a preferred embodiment of the present invention, the main container has a Si vapor supply source capable of supplying Si vapor into the container, and the Si vapor supply source is arranged such that an atomic number ratio Si/C in the main container is higher than 1.

The present invention also relates to a method for manufacturing a SiC semiconductor substrate. That is, in a method for manufacturing a SiC semiconductor substrate according to an aspect of the present invention, a SiC substrate and a SiC material are heated in a manner that the SiC substrate and the SiC material face each other to transport a raw material from the SiC material to the SiC substrate, and a SiC epitaxial layer is formed at a growth rate of equal to or higher than 1.0 µm/min.

As described above, by growing the SiC substrate and the SiC material having a doping concentration lower than that of the SiC substrate in a manner that the SiC substrate and the SiC material face each other, it is possible to reduce parameters to be controlled as compared with the conventional method (chemical vapor deposition method). The growth rate of the SiC epitaxial layer can be set to equal to or higher than 1.0 µ/min.

In a preferred embodiment of the present invention, the growth rate is equal to or higher than 2.0 µm/min.

In a preferred embodiment of the present invention, the SiC material has a doping concentration lower than that of the SiC substrate.

In a preferred embodiment of the present invention, the doping concentration of the SiC material is equal to or lower than $1 \times 10^{17}$ $cm^{-3}$.

By using the SiC material having such a doping concentration, a SiC epitaxial layer having a doping concentration suitable for the withstand voltage layer can be formed.

In a preferred embodiment of the present invention, the SiC substrate is heated in a temperature range of equal to or higher than 1900° C.

By heating in such a temperature range, the SiC epitaxial layer can be formed at high speed.

In a preferred embodiment of the present invention, the SiC epitaxial layer is grown by an amount equal to or higher than 30 µm.

As described above, by growing the SiC epitaxial layer by an amount equal to or higher than 30 µm, a withstand voltage layer suitable for a high withstand voltage semiconductor device can be formed.

In a preferred embodiment of the present invention, the SiC epitaxial layer is grown by an amount equal to or higher than 100 µm.

In a preferred embodiment of the present invention, heating is performed so as to form a raw material transport space having a temperature gradient between the SiC substrate and the SiC material, and the SiC material is arranged on a high temperature side and the SiC substrate is arranged on a low temperature side to transport the raw material.

As described above, by providing the temperature gradient between the SiC substrate and the SiC material, the raw material can be easily transported.

In a preferred embodiment of the present invention, the SiC substrate and the SiC material are arranged and heated in a semi-closed space.

In a preferred embodiment of the present invention, the SiC substrate is arranged and heated in a semi-closed space in which the atomic number ratio Si/C is equal to or lower than 1, thereby reducing the basal plane dislocation density in the SiC epitaxial layer.

By arranging and heating the SiC substrate in the semi-closed space in which the atomic number ratio Si/C is equal to or lower than 1 as described above, a SiC epitaxial layer in which the basal plane dislocation density is reduced can be formed.

In a preferred embodiment of the present invention, the SiC substrate is arranged and heated in a semi-closed space in which an atomic number ratio Si/C is higher than 1 to planarize the surface of the SiC epitaxial layer.

By arranging and heating the SiC substrate in the semi-closed space in which the atomic number ratio Si/C is higher than 1 as described above, the SiC epitaxial layer having the surface in which the macro-step bunching is decomposed can be formed.

In a preferred embodiment of the present invention, the SiC substrate is arranged and heated in a semi-closed space in which the atomic number ratio Si/C is equal to or lower than 1, and then the SiC substrate is arranged and heated in a semi-closed space in which the atomic number ratio Si/C is higher than 1, thereby reducing the basal plane dislocation density in the SiC epitaxial layer.

As described above, by arranging and heating the SiC epitaxial substrate in the semi-closed space in which the atomic number ratio Si/C is equal to or lower than 1, and then arranging and heating the SiC epitaxial substrate in the semi-closed space in which the atomic number ratio Si/C is higher than 1, the SiC epitaxial layer in which the basal plane dislocation (BPD) density is reduced can be formed.

Advantageous Effects of Invention

According to the disclosed technology, it is possible to provide a novel method and a device for manufacturing a SiC epitaxial substrate.

Other problems, features and advantages will become apparent from reading of the following Description of Embodiments when taken up in conjunction with the drawings and claims.

DESCRIPTION OF EMBODIMENTS

Figure 1:
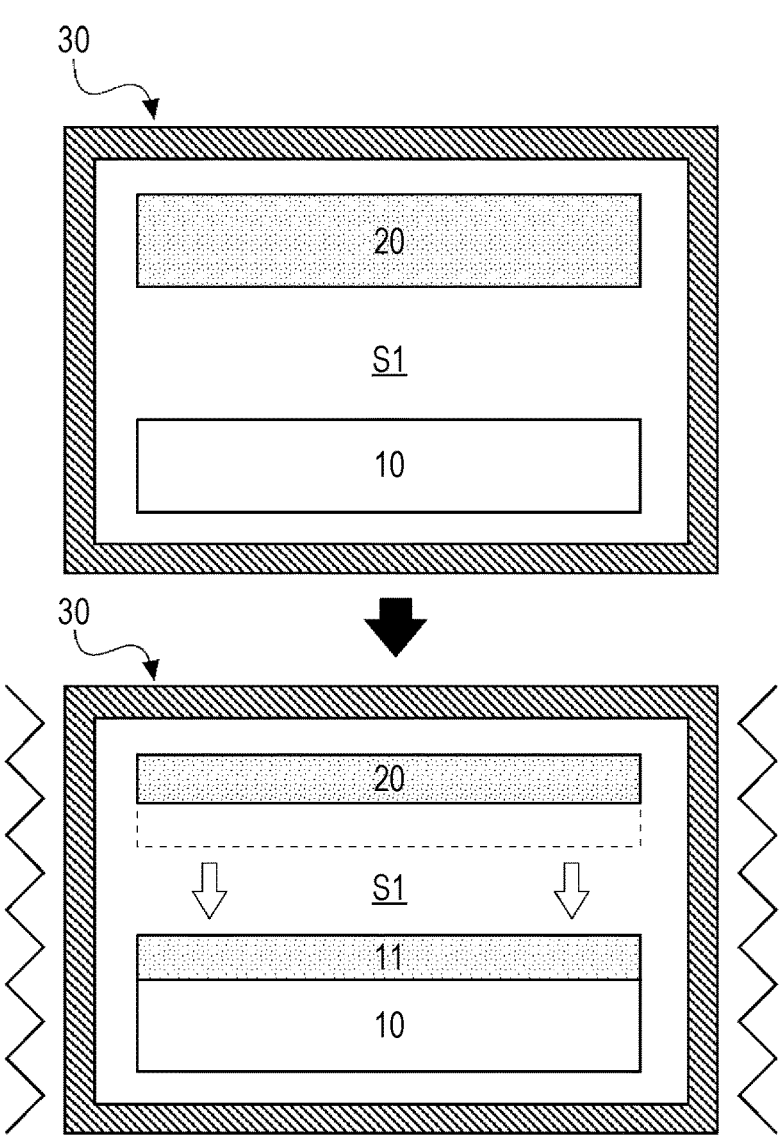
FIG. 1 is an explanatory diagram of a method for manufacturing a SiC epitaxial substrate according to an embodiment.

Hereinafter, a preferred embodiment of the present invention illustrated in the drawings will be described in detail with reference to FIGS. 1 to 12. The technical scope of the present invention is not limited to the embodiments illustrated in the accompanying drawings, and can be appropriately changed within the scope described in the claims.

<<Method for Manufacturing SiC Epitaxial Substrate>>

The present invention can be grasped as a method for manufacturing a SiC epitaxial substrate, the method including: heating a SiC substrate 10 and a SiC material 20 having a doping concentration lower than that of the SiC substrate 10 in a manner that the SiC substrate 10 and the SiC material 20 face each other; and transporting a raw material from the SiC material 20 to the SiC substrate 10 to form a SiC epitaxial layer 11.

Specifically, as illustrated in FIG. 1, the method for manufacturing a SiC epitaxial substrate according to the present invention includes: an arranging process of arranging the SiC substrate 10 and the SiC material 20 having a doping concentration lower than that of the SiC substrate 10 in a manner that the SiC substrate 10 and the SiC material 20 face each other; and a heating process of performing heating to transport a raw material from the SiC material 20 to the SiC substrate 10 to form the SiC epitaxial layer 11.

Further, the present invention can be grasped as a method for manufacturing a SiC epitaxial substrate including heating the SiC substrate 10 and the SiC material 20 in a manner that the SiC substrate 10 and the SiC material 20 face each other to transport a raw material from the SiC material 20 to the SiC substrate 10 to form the SiC epitaxial layer 11 at a growth rate of equal to or higher than 1.0 µm/min.

Specifically, as illustrated in FIG. 1, the method for manufacturing a SiC epitaxial substrate according to the present invention includes: an arranging process of arranging the SiC substrate 10 and the SiC material 20 having a doping concentration lower than that of the SiC substrate 10 in a manner that the SiC substrate 10 and the SiC material 20 face each other; and a heating process of performing heating to transport a raw material from the SiC material 20 to the SiC substrate 10 to form a SiC epitaxial layer 11 at a growth rate of equal to or higher than 1.0 µm/min.

<Arranging Process>

The arranging process according to the present invention is a process of arranging the SiC substrate 10 and the SiC material 20 as a raw material of the SiC epitaxial layer 11 of the SiC substrate 10 in a manner that the SiC substrate 10 and the SiC material 20 face each other. A raw material transport space S1 for transporting a raw material from the SiC material 20 to the surface of the SiC substrate 10 is formed between the SiC substrate 10 and the SiC material 20.

The SiC substrate 10 and the SiC material 20 are preferably arranged such that the surface of the SiC substrate 10 and the surface of the SiC material 20 are substantially parallel to each other so that the SiC epitaxial layer 11 uniformly grows.

The SiC substrate 10 and the SiC material 20 are preferably arranged in a semi-closed space. The semi-closed space can be formed, for example, by accommodation in the main container 30.

The "semi-closed space" in the present specification refers to a space in which the inside of the container can be evacuated but at least a part of the steam generated in the container can be confined.

(Sic Substrate)

The SiC substrate 10 includes a SiC wafer obtained by slicing an ingot produced by a sublimation method or the like into a disk shape, and a SiC substrate obtained by processing single crystal SiC into a thin plate shape. As the crystal polymorph of the single crystal SiC, any polytype can be adopted.

The dopant may be an element generally doped in the SiC substrate 10. Specifically, nitrogen (N), phosphorus (P), aluminum (Al), boron (B), and the like are preferable.

The doping concentration of the SiC substrate 10 is preferably higher than $1\times10^{17}$ cm$^{-3}$, more preferably equal to or higher than $1\times10^{18}$ cm$^{-3}$, and still more preferably equal to or higher than $1\times10^{19}$ cm$^{-3}$.

The dopant and the doping concentration can be checked by Raman spectroscopy or secondary ion mass spectrometry (SIMS).

In the description of the present specification, a surface of the SiC substrate 10 on which the semiconductor element is formed (specifically, a surface on which the SiC epitaxial layer 11 is deposited) is referred to as a main surface 101, and a surface facing the main surface 101 is referred to as a back surface 102. The main surface 101 and the back surface 102 are collectively referred to as a surface, and a direction penetrating the main surface 101 and the back surface 102 is referred to as a front and back direction.

As the main surface 101, a surface provided with an off angle of several degrees (for example, 0.4 to 8°) from a (0001) surface or a (000-1) surface can be exemplified. (In the present specification, in the notation of a Miller index, "—" means a bar attached to the index immediately after the Miller index).

A step/terrace structure is recognized on the surface of the SiC substrate 10 planarized at the atomic level. This step/terrace structure is a staircase structure in which a step which is a step portion of one or more molecular layers and a terrace which is a plane portion where the {0001} surface is exposed are alternately arranged.

In the step, one molecular layer (0.25 nm) has a minimum height (minimum unit), and a plurality of the one molecular layer are layered to form various step heights. In the description of the present specification, a step that is obtained by the step becoming large by bunching and has a height exceeding one unit cell of each polytype is referred to as macro step bunching (MSB).

That is, the MSB is a step obtained by bunching of more than four molecular layers (five or more molecular layers) in the case of 4H—SiC, and is a step obtained by bunching of more than six molecular layers (seven or more molecular layers) in the case of 6H—SiC.

The SiC epitaxial layer 11 grown on the SiC substrate 10 preferably has no basal plane dislocation (BPD) on the surface. Therefore, it is preferable to form the SiC epitaxial layer 11 on the SiC substrate 10 having no BPD on the surface. In addition, it is preferable to convert the BPD into another defect/dislocation during the formation of the SiC epitaxial layer 11.

As the size of the SiC substrate 10, a chip size of several centimeters square, a 6-inch wafer, an 8-inch wafer, or a size higher than those can be exemplified.

(Sic Material)

The SiC material 20 is made of SiC capable of supplying a Si element, a C element, and a dopant to the SiC substrate 10 by heating the SiC material 20 facing the SiC substrate 10. For example, a container made of SiC (main container 30) and a substrate made of SiC (SiC member 36) are included. As the crystal polymorph of the SiC material, any polytype can be adopted, and polycrystalline SiC may be adopted.

As the dopant, a similar element to that of the SiC substrate 10 can be adopted. Specifically, nitrogen (N), phosphorus (P), aluminum (Al), boron (B), and the like are preferable.

The doping concentration of the SiC material 20 is preferably equal to or lower than $1\times10^{17}$ cm$^{-3}$, more preferably equal to or lower than $1\times10^{16}$ cm$^{-3}$, and still more preferably equal to or lower than $1\times10^{15}$ cm$^{-3}$.

The dopant and the doping concentration can be checked by Raman spectroscopy or secondary ion mass spectrometry (SIMS).

(Semi-Closed Space)

The semi-closed space may be configured such that the atomic number ratio Si/C is equal to or lower than 1. For example, when the SiC substrate 10 satisfying the stoichiometric ratio 1:1 and the SiC material 20 satisfying the stoichiometric ratio 1:1 are arranged in the SiC main container 30 satisfying the stoichiometric ratio 1:1, the atomic number ratio Si/C in the main container 30 becomes 1 (see FIG. 4). A C vapor supply source (C pellet or the like) may be arranged to set the atomic number ratio Si/C to equal to or lower than 1.

The semi-closed space may be configured such that the atomic number ratio Si/C is greater than 1. For example, when the SiC substrate 10 satisfying the stoichiometric ratio 1:1, the SiC material 20 satisfying the stoichiometric ratio 1:1, and the Si vapor supply source 35 (Si pellet or the like) are arranged in the SiC main container 30 satisfying the stoichiometric ratio 1:1, the atomic number ratio Si/C in the main container 30 is greater than 1 (see FIG. 5).

<Heating Process>

The heating process according to the present invention is a process of heating the SiC substrate 10 and the SiC material 20 to transport the raw material (Si element, C element, and dopant) of the SiC material 20 to the surface of the SiC substrate 10 via the raw material transport space S1.

As the driving force for transporting the raw material, a temperature gradient or a chemical potential difference between the SiC substrate 10 and the SiC material 20 can be adopted.

Specifically, in the semi-closed space, the vapor including the Si element, the C element, and the dopant sublimated from the SiC material 20 is transported by being diffused in the raw material transport space S1, and is supersaturated and condensed on the SiC substrate 10 set to have a temperature lower than that of the SiC material 20.

In a case where single crystal SiC is adopted for the SiC substrate 10 and polycrystalline SiC is adopted for the SiC material 20, a partial pressure difference (chemical potential difference) generated on the surfaces of the polycrystalline SiC and the single crystal SiC can be used as a driving force of transport.

Figure 2:
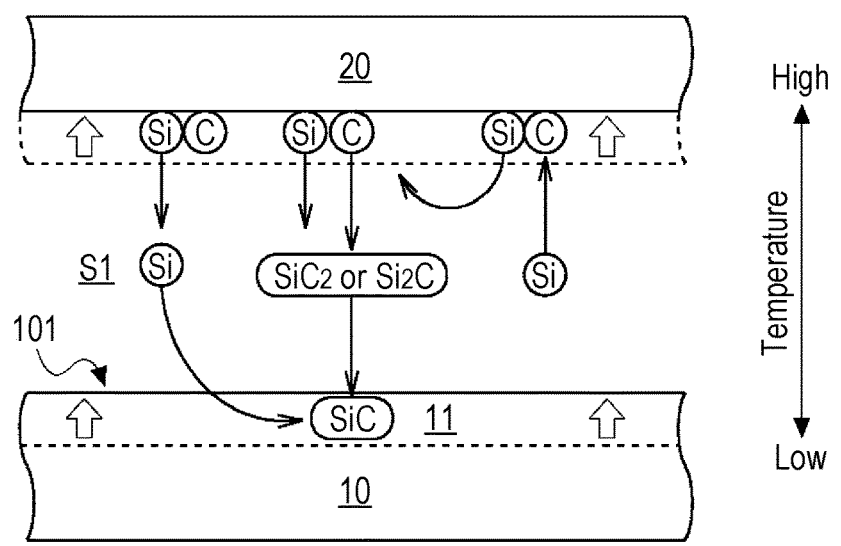
FIG. 2 is an explanatory diagram of the method for manufacturing the SiC epitaxial substrate according to the embodiment.

FIG. 2 is an explanatory diagram illustrating an outline of a growth mechanism. It is considered that, by arranging the SiC substrate 10 and the SiC material 20 facing each other and heating them in a temperature range of equal to or higher than 1400° C. and equal to or lower than 2300° C., the reactions of the following 1) to 5) are continuously performed in the raw material transport space S1, and as a result, the growth of the SiC epitaxial layer 11 proceeds.

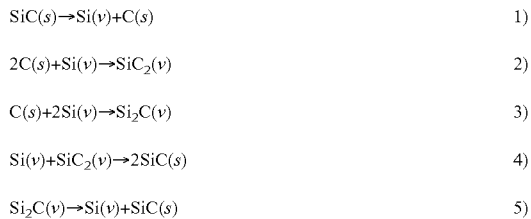

$$SiC(s) \rightarrow Si(v) + C(s) \quad 1)$$

$$2C(s) + Si(v) \rightarrow SiC_2(v) \quad 2)$$

$$C(s) + 2Si(v) \rightarrow Si_2C(v) \quad 3)$$

$$Si(v) + SiC_2(v) \rightarrow 2SiC(s) \quad 4)$$

$$Si_2C(v) \rightarrow Si(v) + SiC(s) \quad 5)$$

Explanation of 1): When the SiC material 20 (SiC(s)) is heated, Si atoms (Si(v)) are desorbed from SiC by thermal decomposition.

Explanation of 2) and 3): C(C(s)) remaining on the surface of the SiC substrate 10 due to desorption of Si atoms (Si(v)) reacts with Si vapor (Si(v)) in the raw material transport space S1 to become $Si_2C$, $SiC_2$, or the like and sublimate in the raw material transport space S1.

Explanation of 4) and 5): Sublimated $Si_2C$, $SiC_2$, or the like reaches and diffuses to the terrace of the SiC substrate 10 due to a temperature gradient or a chemical potential difference, and reaches a step, so that the SiC epitaxial layer 11 grows by taking over the crystal polymorph of the SiC substrate 10 (step flow growth).

At this time, since the dopant of the SiC material 20 is also transported together with the raw material, the SiC epitaxial layer 11 is grown with the same doping concentration as that of the SiC material 20.

The heating temperature in the heating process is preferably set in a range of 1400 to 2300° C., and more preferably set to equal to or higher than 1600° C.

The heating temperature in the heating process is preferably in the range of 1400 to 2300° C., more preferably equal to or higher than 1900° C., more preferably equal to or higher than 1950° C., more preferably equal to or higher than 2000° C., and still more preferably equal to or higher than 2050° C.

The growth rate of the SiC epitaxial layer 11 in the heating process can be controlled by the temperature range, and can be selected in the range of 0.001 to 2 μm/min.

The growth rate of the SiC epitaxial layer 11 in the heating process can be controlled by the temperature range, and is preferably equal to or higher than 1.0 μm/min, more preferably equal to or higher than 1.5 μm/min, more preferably equal to or higher than 1.8 μm/min, and still more preferably equal to or higher than 2.0 μm/min.

The heating time in the heating process can be set to any time so as to obtain a desired growth amount. For example, when the growth rate is 1 μm/min and the growth amount is desired to be 1 μm, the heating time is 1 minute.

The growth amount of the SiC epitaxial layer 11 in the heating process can be set to a desired growth amount by the growth temperature and the growth time. For example, the SiC epitaxial layer 11 is preferably grown by an amount equal to or higher than 30 μm. Further, the SiC epitaxial layer 11 is preferably grown by an amount equal to or higher than 100 μm.

The temperature gradient of the raw material transport space S1 in the heating process is set in a range of 0.1 to 5° C./mm.

A dopant gas may be supplied according to a desired doping concentration.

The heating process preferably includes a process (basal plane dislocation reduction process) of reducing the BPD density in the SiC epitaxial layer 11 by arranging and heating the SiC substrate 10 in a semi-closed space in which the atomic number ratio Si/C is equal to or lower than 1. In this basal plane dislocation reduction process, for example, the SiC substrate 10 having a surface BPD density of 1000 pieces $cm^{-2}$ is arranged and heated in a semi-closed space having an atomic number ratio Si/C of equal to or lower than 1. As a result, the SiC epitaxial layer 11 having a surface BPD density of 1.0 piece $cm^{-2}$ or lower can be formed.

The heating process preferably includes a process (planarization process) of planarizing the surface of the SiC epitaxial layer 11 by arranging and heating the SiC substrate 10 in a semi-closed space in which the atomic number ratio Si/C is higher than 1. In this planarizing process, for example, the SiC substrate 10 in which the MSB exists on the surface is arranged and heated in a semi-closed space in which the atomic number ratio Si/C is higher than 1. As a result, the SiC epitaxial layer 11 having the surface from which the MSB is decomposed can be formed.

The heating process preferably includes a process (basal plane dislocation reduction process) of reducing the BPD density in the SiC epitaxial layer 11 by arranging and heating the SiC substrate 10 in a semi-closed space in which the atomic number ratio Si/C is equal to or lower than 1 to planarize the surface of the SiC epitaxial layer (planarizing process), and then arranging and heating the SiC substrate 10 in a semi-closed space in which the atomic number ratio Si/C is higher than 1.

As described above, the SiC substrate 10 having the surface from which the MSB is decomposed in the flattening process is arranged and heated in the semi-closed space in which the atomic number ratio Si/C is equal to or lower than 1, so that the SiC epitaxial layer 11 having the surface from which the BPD is reduced or removed can be formed.

In the method for manufacturing a SiC epitaxial substrate according to the present invention, the SiC substrate 10 and the SiC material 20 having a doping concentration lower than that of the SiC substrate 10 are heated in a manner that the SiC substrate 10 and the SiC material 20 face each other, and a raw material is transported from the SiC material 20 to the SiC substrate 10 to form the SiC epitaxial layer 11. As a result, the SiC epitaxial layer 11 serving as the withstand voltage layer of the SiC semiconductor device can be grown using the heating temperature as a parameter.

That is, unlike the conventional method (chemical vapor deposition method), the method for manufacturing the SiC epitaxial substrate according to the present invention can form the SiC epitaxial layer 11 in which the doping concentration is controlled without controlling the flow rates of the plurality of gases (the source gas and the doping gas).

As one mode of the method for manufacturing the SiC epitaxial substrate according to the present invention, there is a mode in which the SiC epitaxial layer 11 having a doping concentration of equal to or lower than $1 \times 10^{17}$ $cm^{-3}$ is grown on one surface of the SiC substrate 10 having a doping concentration of $3 \times 10^{18}$ $cm^{-3}$, and the other surface of the SiC substrate 10 is etched.

As one mode of the method for manufacturing the SiC epitaxial substrate according to the present invention, there is a mode not including the mode in which the SiC epitaxial layer 11 having a doping concentration of equal to or lower than $1 \times 10^{17}$ $cm^{-3}$ is grown on one surface of the SiC substrate 10 having a doping concentration of $3 \times 10^{18}$ $cm^{-3}$, and the other surface of the SiC substrate 10 is etched.

<<Device for Manufacturing SiC Epitaxial Substrate>>

First Embodiment

A device for manufacturing a SiC epitaxial substrate according to a first embodiment of the present invention will be described in detail below. In this embodiment, the same reference signs are given to components that are basically the same as those described in the above manufacturing method, and the description thereof will be simplified.

Figure 3:
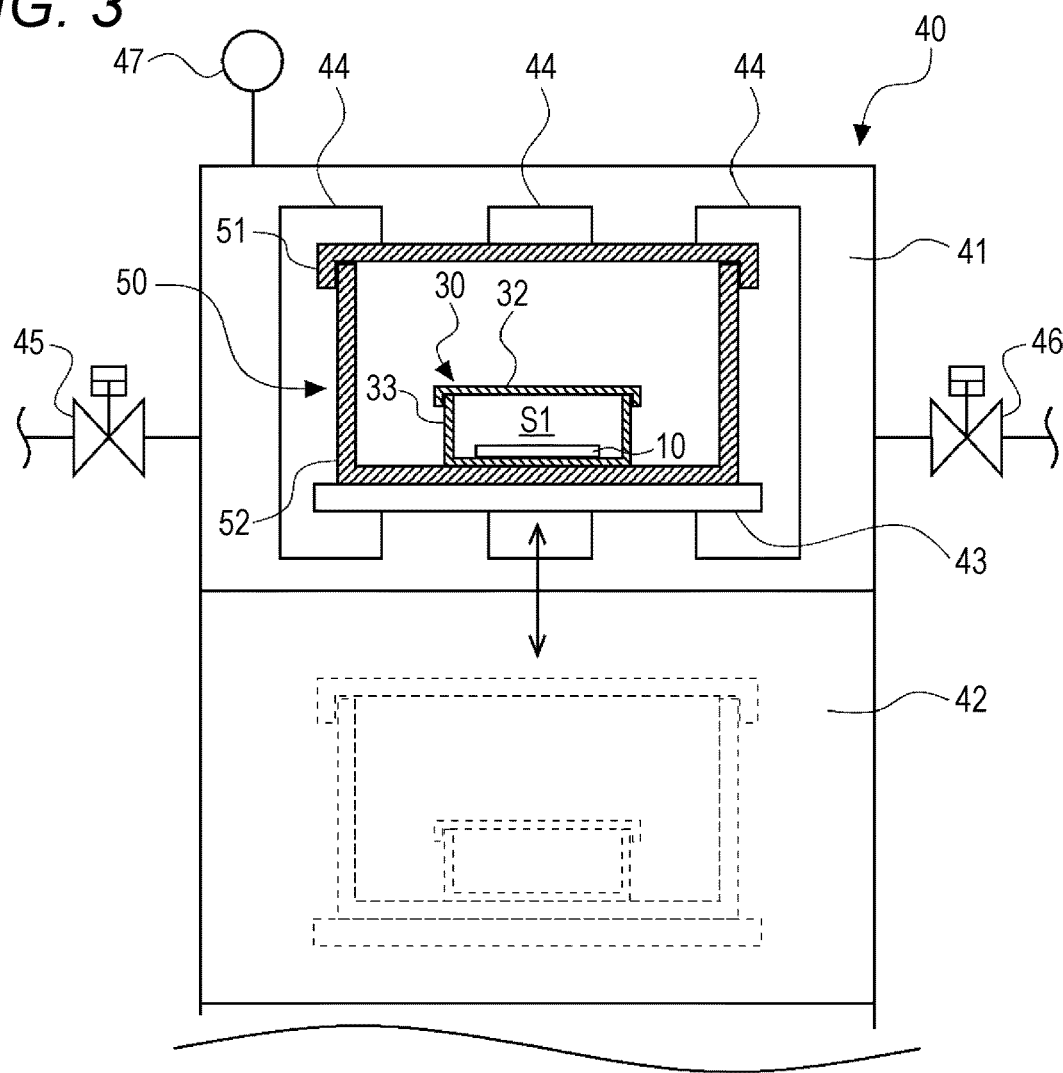
FIG. 3 is an explanatory diagram of a device for manufacturing a SiC epitaxial substrate according to a first embodiment.

As illustrated in FIG. 3, the device for manufacturing a SiC epitaxial substrate according to the first embodiment includes a main container 30 capable of accommodating a SiC substrate 10 and made of a SiC material 20, and a heating furnace 40 capable of heating to form a temperature gradient between the SiC substrate 10 and the SiC material 20.

(Main Container)

The main container 30 is a fitting container including a substrate installation portion 31 on which the SiC substrate 10 is installed, and an upper container 32 and a lower container 33 that can be fitted to each other. A minute gap 34 is formed in a fitting portion between the upper container 32 and the lower container 33, and the inside of the main container 30 can be exhausted (evacuated) from the gap 34.

The substrate installation portion 31 is provided on the bottom surface side of the lower container 33, and the SiC substrate 10 is installed thereon. Although not illustrated, a pedestal or the like that supports the SiC substrate 10 may be provided.

The upper container 32 is made of polycrystalline SiC. Therefore, the SiC material 20 that supplies the raw material to the SiC substrate 10 is obtained. The upper container 32 is set to have a doping concentration lower than that of the SiC substrate 10.

As similar to the upper container 32, the lower container 33 is made of polycrystalline SiC. It is sufficient that the container is made of a high melting point material that can withstand high heat, and the same material as that of the high melting point container 50 to be described later can be adopted.

That is, the main container 30 includes the substrate installation portion 31 on which the SiC substrate 10 is installed, the SiC material 20 facing the substrate installation portion 31, and a raw material transport space S1 for transporting a raw material from the SiC material 20 to the SiC substrate 10. The doping concentration of the SiC material 20 is set to be lower than that of the SiC substrate 10.

The main container 30 is configured to generate an atmosphere containing Si element and a C element in an internal space when heat treatment is performed in a state where the SiC substrate 10 is accommodated. In the main container 30 according to the first embodiment, the entire main container 30 is made of polycrystalline SiC. By heating the main container 30, an atmosphere containing Si element and a C element can be formed in the internal space.

The space in the heat-treated main container 30 is desirably a vapor pressure environment of a mixed system of a gaseous species containing Si element and a gaseous species containing the C element. Examples of the gaseous species containing Si element include Si, $Si_2$, $Si_3$, $Si_2C$, $SiC_2$, and SiC. Examples of the gaseous species containing the C element include $Si_2C$, $SiC_2$, SiC, and C. That is, it is preferable that the SiC-based gas exists in the semi-closed space.

The raw material transport space S1 is a space for transporting a raw material to the surface of the SiC substrate 10 using a temperature gradient or a chemical potential difference provided between the SiC substrate 10 and the SiC material 20 as a driving force.

Figure 4:
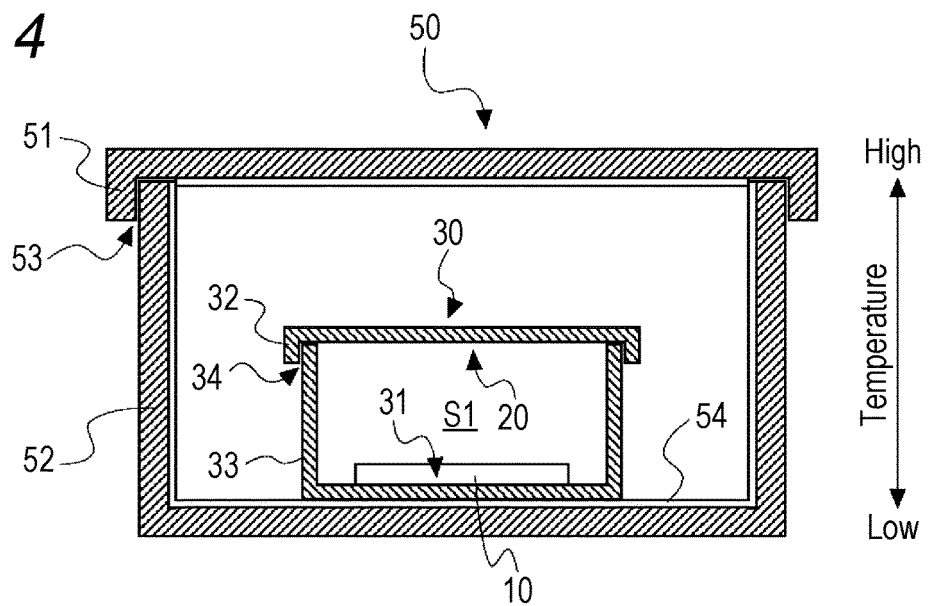
FIG. 4 is an explanatory diagram of the device for manufacturing the SiC epitaxial substrate according to the first embodiment.

For example, when the temperature of the surface (main surface 101 or back surface 102) of the SiC substrate 10 is compared with the temperature of the SiC material 20 (upper container 32) facing the main surface 101, the SiC substrate 10 is arranged such that the temperature on the SiC substrate 10 side is low and the temperature of the upper container 32 side is high (see FIG. 4). As described above, by forming the space (raw material transport space S1) provided with a temperature difference between the main surface 101 and the upper container 32, the raw material (Si element, C element, and dopant) of the SiC material 20 can be transported to the surface of the SiC substrate 10 using the temperature difference as a driving force.

The main container 30 may be provided with a Si vapor supply source 35 capable of supplying Si vapor into the container. Examples of the Si vapor supply source 35 can include solid Si (Si pellet such as a single crystal Si piece or Si powder) and a Si compound.

For example, when the entire main container 30 is made of polycrystalline SiC as in the present embodiment, by arranging the Si vapor supply source, the atomic number ratio Si/C in the main container 30 is higher than 1.

Figure 5:
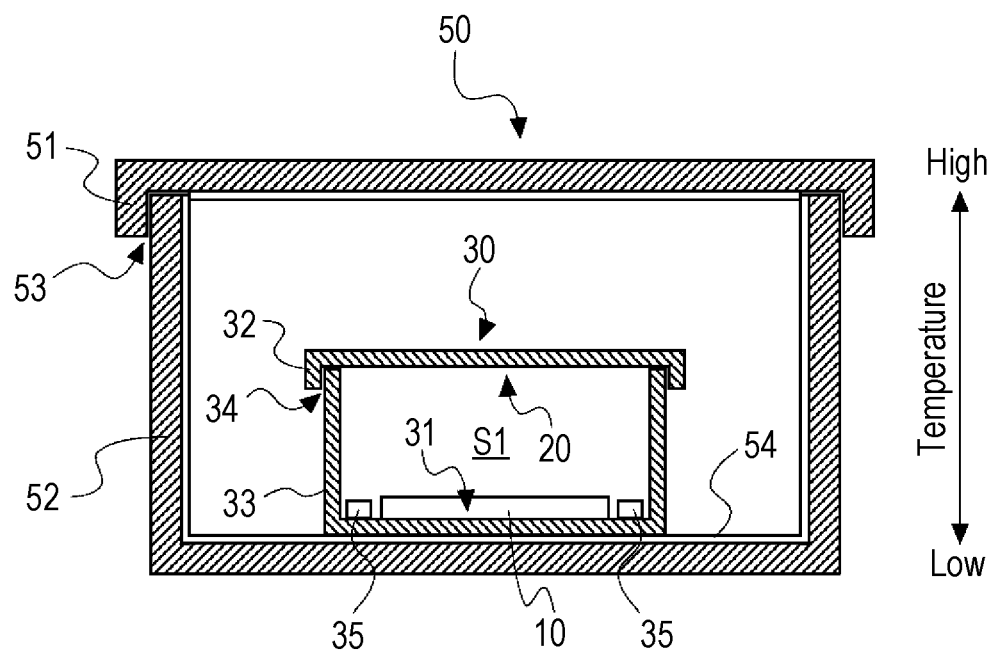
FIG. 5 is an explanatory diagram of the device for manufacturing the SiC epitaxial substrate according to the first embodiment.

Specifically, when the SiC substrate 10 satisfying the stoichiometric ratio 1:1 and the Si vapor supply source 35 (Si pellet or the like) are arranged in the polycrystalline SiC main container 30 satisfying the stoichiometric ratio 1:1, the atomic number ratio Si/C in the main container 30 becomes higher than 1 (see FIG. 5).

As described above, by heating the space where the atomic number ratio Si/C is higher than 1, it is possible to bring the space close to the environment of the vapor pressure (SiC—Si equilibrium vapor pressure environment) when SiC (solid) and Si (liquid phase) are in the phase equilibrium state via the gas phase.

On the other hand, when the Si vapor supply source is not provided in the main container 30, the atomic number ratio Si/C in the main container 30 is equal to or lower than 1.

Specifically, when the SiC substrate 10 satisfying the stoichiometric ratio 1:1 is arranged in the polycrystalline SiC main container 30 satisfying the stoichiometric ratio 1:1, the atomic number ratio Si/C in the main container 30 becomes 1 (see FIG. 4).

As described above, by heating the space where the atomic number ratio Si/C is equal to or lower than 1, it is possible to bring the space close to the environment of the vapor pressure (SiC—C equilibrium vapor pressure environment) when SiC (solid phase) and C (solid phase) are in the phase equilibrium state via the gas phase.

The SiC—Si equilibrium vapor pressure environment and the SiC—C equilibrium vapor pressure environment in the present specification include a near-thermal equilibrium vapor pressure environment that satisfies the relationship between the growth rate and the growth temperature derived from the theoretical thermal equilibrium environment.

The SiC—Si vapor pressure environment refers to an environment of vapor pressure when SiC (solid) and Si (liquid phase) are in a phase equilibrium state via a gas phase.

The SiC—Si equilibrium vapor pressure environment is formed, for example, by heat-treating a semi-closed space in which the atomic number ratio Si/C is higher than 1.

The SiC—C equilibrium vapor pressure environment refers to an environment of vapor pressure when SiC (solid phase) and C (solid phase) are in a phase equilibrium state via a gas phase.

The SiC—C equilibrium vapor pressure environment is formed, for example, by heat-treating a semi-closed space in which the atomic number ratio Si/C is equal to or lower than 1.

(Heating Furnace)

As illustrated in FIG. 3, the heating furnace 40 includes: a main heating chamber 41 capable of heating a workpiece (SiC substrate 10 or the like) to a temperature of equal to or higher than 1000° C. and equal to or lower than 2300° C.; a preheating chamber 42 capable of preheating the workpiece to a temperature of equal to or higher than 500° C.; a high melting point container 50 capable of accommodating the main container 30; and a moving means 43 (moving table) capable of moving the high melting point container 50 from the preheating chamber 42 to the main heating chamber 41.

The heating chamber 41 has a regular hexagonal shape in planar cross-sectional view, and the high melting point container 50 is arranged inside the heating chamber 41.

A heater 44 (mesh heater) is provided inside the heating chamber 41. A multilayer heat reflective metal plate is fixed to a side wall and a ceiling of heating chamber 41 (not illustrated). The multilayer heat reflective metal plate is configured to reflect heat of the heater 44 toward a substantially central portion of the main heating chamber 41.

As a result, in the heating chamber 41, the heater 44 is arranged so as to surround the high melting point container 50 in which the workpiece is accommodated, and the multilayer heat reflective metal plate is arranged on the outer side thereof, so that the temperature can be raised to a temperature of equal to or higher than 1000° C. and equal to or lower than 2300° C.

As the heater 44, for example, a resistance heating type heater or a high frequency induction heating type heater can be used.

The heater 44 may adopt a configuration capable of forming a temperature gradient in the high melting point container 50. For example, the heater 44 may be configured such that many heaters are arranged on the upper side. Further, the heater 44 may be configured such that the width increases toward the upper side. Alternatively, the heater 44 may be configured to be able to increase the power supplied toward the upper side.

A vacuum forming valve 45 for exhausting the inside of the main heating chamber 41, an inert gas injection valve 46 for introducing an inert gas into the main heating chamber 41, and a vacuum gauge 47 for measuring the degree of vacuum in the main heating chamber 41 are connected to the main heating chamber 41.

The vacuum forming valve 45 is connected to an evacuation pump that exhausts and evacuates the inside of the main heating chamber 41 (not illustrated). The degree of vacuum in the heating chamber 41 can be adjusted to, for example, 10 Pa or lower, more preferably 1 Pa or lower, and still more preferably $10^{-3}$ Pa or lower by the vacuum forming valve 45 and the evacuation pump. Examples of the evacuation pump can include a turbo molecular pump.

The inert gas injection valve 46 is connected to an inert gas supply source (not illustrated). By the inert gas injection valve 46 and the inert gas supply source, the inert gas can be introduced into the main heating chamber 41 in the range of $10^{-5}$ to 10000 Pa. As the inert gas, Ar, He, $N_2$, or the like can be selected.

The inert gas injection valve 46 is a dopant gas supply means capable of supplying a dopant gas into the main container 30. That is, by selecting a dopant gas (for example, $N_2$ or the like) as the inert gas, the doping concentration of the SiC epitaxial layer 11 can be adjusted.

The preheating chamber 42 is connected to the main heating chamber 41, and is configured to be able to move the high melting point container 50 by the moving means 43.

The preheating chamber 42 of the present embodiment is configured to be capable of raising the temperature by residual heat of the heater 44 of the main heating chamber 41. For example, when the temperature of the main heating chamber 41 is raised to 2000° C., the temperature of the preheating chamber 42 is raised to about 1000° C., and the object to be processed (SiC substrate 10, main container 30, high melting point container 50, and the like) can be degassed.

The moving means 43 is configured to be able to move in the main heating chamber 41 and the preheating chamber 42 with the high melting point container 50 placed thereon. Since the transportation between the main heating chamber 41 and the preheating chamber 42 by the moving means 43 is completed in about 1 minute at the shortest, it is possible to realize temperature rise and temperature drop at 1 to 1000° C./min.

Since the rapid temperature raise and the rapid temperature drop can be performed in this manner, it is possible to observe a surface shape having no low-temperature growth history during temperature rise and temperature drop, which is difficult in conventional devices.

In FIG. 3, the preheating chamber 42 is arranged below main heating chamber 41. However, the present invention is not limited to this, and the preheating chamber 42 may be arranged in any direction.

The moving means 43 according to the present embodiment is a moving table on which the high melting point container 50 is placed. The minute heat is released from the contact portion between the moving table and the high melting point container 50. As a result, a temperature gradient can be formed in the high melting point container 50 (and in the main container 30).

That is, in the heating furnace 40 of the present embodiment, since the bottom of the high melting point container 50 is in contact with the moving table, a temperature gradient is provided so that the temperature decreases from the upper container 51 toward the lower container 52 of the high melting point container 50. This temperature gradient is desirably formed along the front and back direction of the SiC substrate 10.

As described above, the temperature gradient may be formed by the configuration of the heater 44.

(High-Melting Point Container)

It is preferable that the heating furnace 40 forms an atmosphere containing Si element, and the main container 30 can be heated in this atmosphere. The atmosphere containing Si element in the heating furnace 40 according to the present embodiment is formed using the high melting point container 50 and the Si vapor supply source 54.

As a matter of course, any method capable of forming an atmosphere containing Si element around the main container 30 can be adopted.

The high melting point container 50 contains a high melting point material. For example, C which is a general-purpose heat-resistant member, W, Re, Os, Ta, and Mo which are high melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, $TiB_2$ which are borides, polycrystalline SiC, and the like can be exemplified.

As similar to the main container 30, the high melting point container 50 is a fitting container including an upper container 51 and a lower container 52 that can be fitted to each other, and is configured to be able to accommodate the main container 30. A minute gap 53 is formed in a fitting portion between the upper container 51 and the lower container 52, and the inside of the high melting point container 50 can be exhausted (evacuated) from the gap 53.

The high melting point container 50 preferably includes a Si vapor supply source 54 capable of supplying vapor pressure of a gaseous species containing Si element into the high melting point container 50. It is sufficient that the Si vapor supply source 54 is configured to generate Si vapor in the high melting point container 50 at the time of heat treatment, and for example, solid Si (Si pellet such as a single crystal Si piece or Si powder) or a Si compound can be exemplified.

The device for manufacturing a SiC substrate according to the present embodiment employs TaC as the material of the high melting point container 50, and employs tantalum silicide as the Si vapor supply source 54. That is, as illustrated in FIG. 4, a tantalum silicide layer is formed inside the high melting point container 50, and Si vapor is supplied into the container from the tantalum silicide layer during the heat treatment, so that a Si vapor pressure environment is formed.

In addition, any configuration can be adopted as long as the vapor pressure of the gaseous species containing Si element is formed in the high melting point container 50 during the heat treatment.

In the device for manufacturing a SiC epitaxial substrate according to the present invention, the SiC substrate 10 and the SiC material 20 having a doping concentration lower than that of the SiC substrate 10 are heated in a manner that the SiC substrate 10 and the SiC material 20 face each other, and a raw material is transported from the SiC material 20 to the SiC substrate 10 to form the SiC epitaxial layer 11. As a result, the SiC epitaxial layer 11 functioning as the withstand voltage layer of the SiC semiconductor device can be grown using the heating temperature as a parameter.

The device for manufacturing a SiC epitaxial substrate according to the present invention can form the SiC epitaxial layer 11 having a doping concentration that is the same as the doping concentration of the SiC material 20. Therefore, by selecting the SiC material 20 having a desired doping concentration, the doping concentration of the SiC epitaxial layer 11 can be controlled.

Second Embodiment

Figure 6:
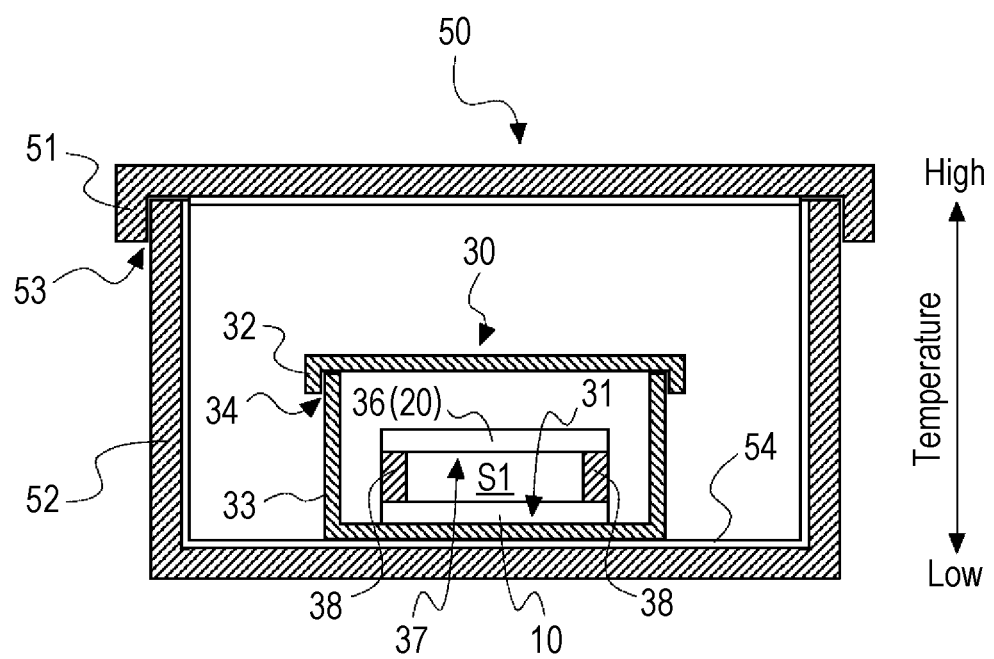
FIG. 6 is an explanatory diagram of a device for manufacturing a SiC epitaxial substrate according to a second embodiment.

FIG. 6 is an explanatory diagram of a device for manufacturing a SiC epitaxial substrate according to a second embodiment. A main container 30 according to the second embodiment is configured to be able to supply a raw material from a SiC member 36 to a SiC substrate 10. In this embodiment, the same reference signs are given to components that are basically the same as those in the above embodiment, and the description thereof will be simplified.

(Main Container)

The main container 30 according to the second embodiment includes: a substrate installation portion 31 on which the SiC substrate 10 is installed; a SiC material installation portion 37 on which the SiC member 36 (SiC material 20) is installed at a position facing the substrate installation portion 31; a raw material transport space S1 for transporting a raw material from the SiC member 36 to the SiC substrate 10; and a support 38 provided between the SiC substrate 10 and the SiC member 36.

The doping concentration of the SiC member 36 is set to be lower than that of the SiC substrate 10.

It is desirable that the support 38 be made of the same high melting point material as that of the high melting point container 50.

The device for manufacturing a SiC substrate according to the present embodiment has a configuration in which the SiC member 36 is installed in the main container 30 and a raw material is transported from the SiC member 36 to the SiC substrate 10. Therefore, the main container 30 can be made of any material. Specifically, a high melting point material similar to that of the high melting point container 50 can be adopted.

Third Embodiment

Figure 7:
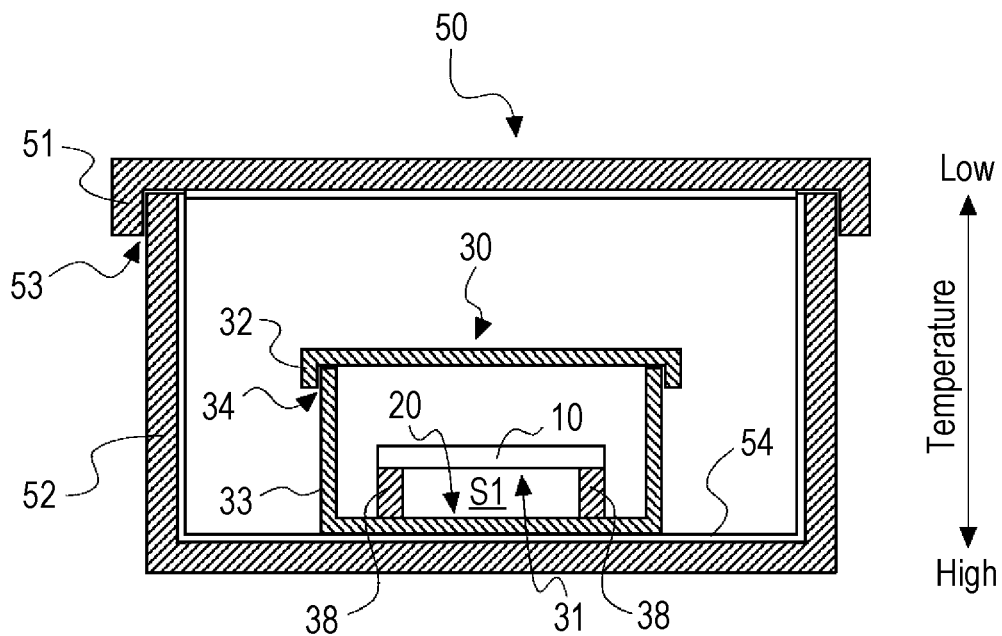
FIG. 7 is an explanatory diagram of a device for manufacturing a SiC epitaxial substrate according to a third embodiment.

FIG. 7 is an explanatory diagram of a device for manufacturing a SiC epitaxial substrate according to a third embodiment. A main container 30 according to the third embodiment is configured to be able to grow at a temperature gradient different from that of the previous embodiments. In this embodiment, the same reference signs are given to components that are basically the same as those in the above embodiment, and the description thereof will be simplified.

(Main Container)

The main container 30 according to the third embodiment includes: a substrate installation portion 31 on which a SiC substrate 10 is installed; a support 38 provided between the SiC substrate 10 and a SiC material 20; and a raw material transport space S1 for transporting a raw material from the SiC material 20 to the SiC substrate 10.

As illustrated in FIG. 6, the SiC material 20 may be the lower container 33 made of polycrystalline SiC, or the SiC member 36 may be arranged under the support 38.

(Heating Furnace)

In the heating furnace 40 of the present embodiment, a temperature gradient is formed so that the temperature decreases from the lower container 52 toward the upper container 51 of the high melting point container 50.

This temperature gradient is formed, for example, by providing a contact portion with the moving table on the ceiling of the high melting point container 50 so that heat is dissipated upward.

For example, the heater 44 may be configured such that many heaters are arranged on the upper side. Further, the heater 44 may be configured such that the width increases toward the upper side. Alternatively, the heater 44 may be configured to be able to increase the power supplied toward the upper side.

The device for manufacturing a SiC substrate according to the present embodiment can grow the SiC epitaxial layer 11 with the main surface 101 of the SiC substrate 10 facing downward. Therefore, it is possible to suppress mixing of the downfall moving in the gravity direction into the surface of the SiC substrate 10.

EXAMPLES

The present invention will be described more specifically with reference to Examples 1 and 2.

Example 1

<Arranging Process>

Under the following conditions, the SiC substrate 10 was accommodated in the main container 30, and the main container 30 was accommodated in the high melting point container 50.

Figure 8:
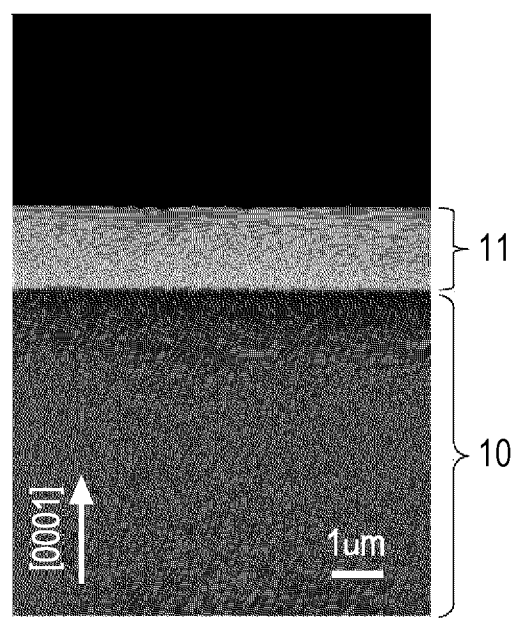
FIG. 8 is a cross-sectional SEM image of a SiC substrate in which a SiC epitaxial layer is formed by the method for manufacturing a SiC epitaxial substrate according to the embodiment.

(Sic Substrate)
  Polymorphism: 4H—SiC
  Substrate size: width 10 mm×length 10 mm×thickness 0.3 mm
  Off direction and off angle: <11-20> direction 4° off
  Growth surface: (0001) surface
Dopant: N
  Doping concentration: $3\times10^{18}$ cm$^{-3}$
  Presence or absence of macro-step bunching: absent
  The dopant and the doping concentration of the SiC substrate 10 were checked by Raman spectroscopy.
(Main Container)
  Material: polycrystalline SiC
  Container size: diameter 60 mm×height 4 mm
  Distance between SiC substrate 10 and SiC material 20: 2 mm
Dopant: N
  Doping concentration: equal to or lower than $1\times10^{17}$ cm$^{-3}$ (Raman spectroscopy detection limit or lower)
  Atomic number ratio Si/C in container: equal to or lower than 1
(High-Melting Point Container)
  Material: TaC
  Container size: diameter 160 mm×height 60 mm
  Si vapor supply source 54 (Si compound): TaSi$_2$
<Heating Process>
  The SiC substrate 10 arranged under the above conditions was subjected to heat treatment under the following conditions.
  Heating temperature: 1700° C.
  Heating time: 300 min
  Temperature gradient: 1° C./mm
  Growth rate: 5 nm/min
  Vacuum degree of main heating chamber 41: $10^{-5}$ Pa FIG. 8 is a SEM image obtained by observing the SiC substrate of Example 1 grown and etched under the above conditions at a magnification×10000 from the cross section. The thickness of the SiC epitaxial layer 11 of Example 1 was 1.5 μm.

The doping concentration of the SiC epitaxial layer 11 of Example 1 was equal to or lower than $1\times10^{17}$ cm$^{-3}$, and the doping concentration of the SiC substrate 10 was $3\times10^{18}$ cm$^{-3}$. As illustrated in FIG. 8, since the SiC epitaxial layer 11 has a brighter SEM image contrast than the SiC substrate 10, it can be grasped that the doping concentration of the SiC epitaxial layer 11 is lower than that of the SiC substrate 10.

<BPD Conversion Rate in SiC Epitaxial Growth Layer>

Figure 9:
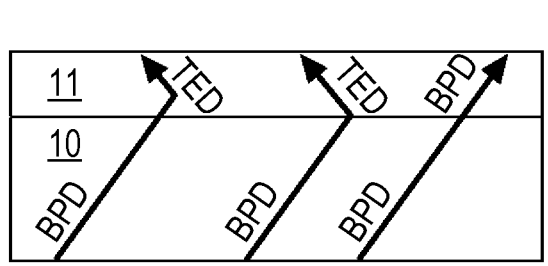
FIG. 9 is an explanatory diagram of a method for obtaining a BPD conversion rate in the method for manufacturing the SiC epitaxial substrate according to the embodiment.
Figure 9:
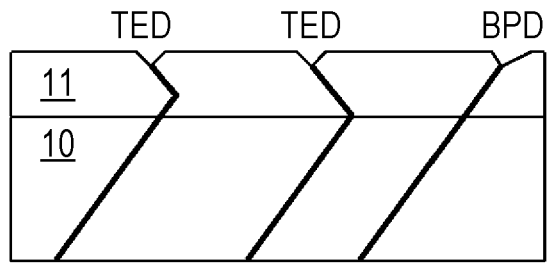
Figure 9:
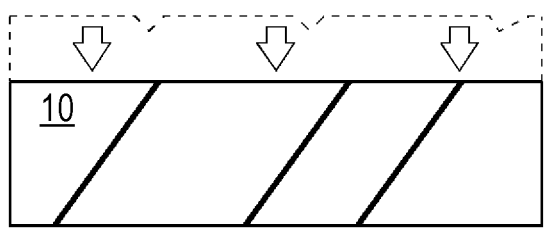
Figure 9:
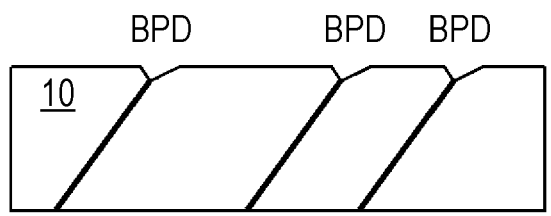

FIG. 9 is an explanatory diagram of a method of obtaining a conversion rate of conversion from BPD to another defect/dislocation (TED or the like) in the SiC epitaxial layer 11.

FIG. 9(a) illustrates a state in which the SiC epitaxial layer 11 is grown by the heating process. In this heating process, the BPD existing on the SiC substrate 10 is converted into TED with a certain probability. Therefore, unless 100% conversion is performed, TED and BPD are mixed on the surface of the SiC epitaxial layer 11.

FIG. 9(b) illustrates a state in which defects in the SiC epitaxial layer 11 are checked using the KOH dissolution etching method. This KOH dissolution etching method is a method of immersing a SiC substrate in a dissolved salt (KOH or the like) heated to about 500° C., forming etch pits in dislocations and defect portions, and determining the type of dislocations on the basis of the size and shape of the etch pits. By this method, the number of BPD existing on the surface of the SiC epitaxial layer 11 is obtained.

FIG. 9(c) illustrates a state in which the SiC epitaxial layer 11 is removed after the KOH dissolution etching. In this method, after planarization to the etch pit depth by mechanical polishing, CMP, or the like, the SiC epitaxial layer 11 is removed by thermal etching to expose the surface of the SiC substrate 10.

FIG. 9(d) illustrates a state in which defects in the SiC substrate 10 are checked using the KOH dissolution etching method on the SiC substrate 10 from which the SiC epitaxial layer 11 has been removed. By this method, the number of BPD existing on the surface of the SiC substrate 10 is obtained.

By comparing the number of BPD present on the surface of the SiC epitaxial layer 11 (see FIG. 9(b)) with the number of BPD present on the surface of the SiC substrate 10 (see FIG. 9(d)) according to the series of order illustrated in FIG. 9, it is possible to obtain the BPD conversion rate of conversion from BPD to other defects and dislocations during the heating process.

The number of BPD present on the surface of the SiC epitaxial layer 11 of Example 1 was about 0 cm$^{-2}$, and the number of BPD present on the surface of the SiC substrate 10 was 1000 cm$^{-2}$.

That is, it can be grasped that the BPD is reduced or removed by arranging and heating the SiC substrate 10 having no MSB on the surface in the semi-closed space in which the atomic number ratio Si/C is equal to or lower than 1.

According to the present invention, the SiC substrate 10 and the SiC material 20 having a doping concentration lower than that of the SiC substrate 10 are heated in a manner that the SiC substrate 10 and the SiC material 20 face each other, and a raw material is transported from the SiC material 20 to the SiC substrate 10 to form the SiC epitaxial layer 11. As a result, the SiC epitaxial layer 11 having a doping concentration that can function as a withstand voltage layer of a semiconductor device can be grown.

According to the present invention, the SiC substrate 10 is arranged and heated in the semi-closed space in which the atomic number ratio Si/C is equal to or lower than 1, so that the SiC epitaxial layer 11 functioning as a withstand voltage layer and having the surface from which the BPD is reduced or removed can be formed.

Example 2

<Arranging Process>
Under the following conditions, the SiC substrate 10 was accommodated in the main container 30, and the main container 30 was accommodated in the high melting point container 50.
(Sic Substrate)
  Polymorphism: 4H—SiC
  Substrate size: width 10 mm×length 10 mm×thickness 0.3 mm
  Off direction and off angle: <11-20> direction 4° off
  Growth surface: (0001) surface
Dopant: N
  Doping concentration: $3\times10^{18}$ cm$^{-3}$
  Presence or absence of macro-step bunching: present
  The dopant and the doping concentration of the SiC substrate 10 were checked by Raman spectroscopy.
(Main Container)
  Material: polycrystalline SiC
  Container size: diameter 60 mm×height 4 mm
  Distance between SiC substrate 10 and SiC material 20: 2 mm Dopant: N
 Doping concentration: equal to or lower than $1\times10^{17}$ cm$^{-3}$ (Raman spectroscopy detection limit or lower)
 Si vapor supply source 35: Si piece
 Atomic number ratio Si/C in container: higher than 1
 By accommodating the Si piece together with the SiC substrate 10 in the main container 30, the atomic number ratio Si/C in the container is higher than 1.

Figure 10:
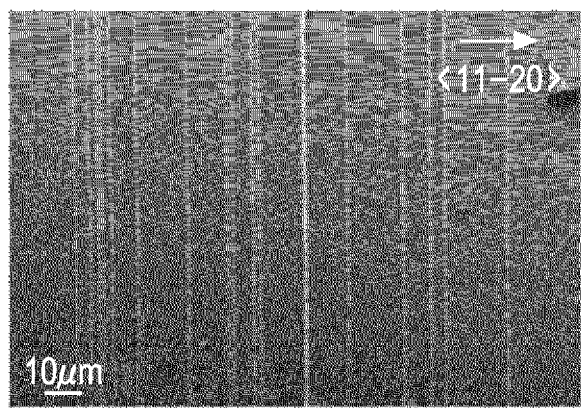
FIG. 10 is a SEM image of a surface of a SiC substrate observed before SiC epitaxial layer growth in the method for manufacturing a SiC epitaxial substrate according to the embodiment.
Figure 10:
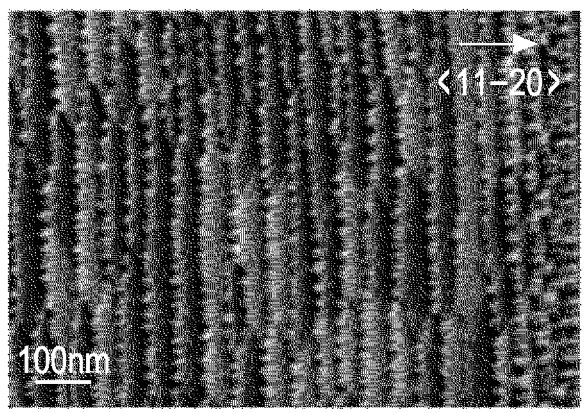

(High-Melting Point Container)
 Material: TaC
 Container size: diameter 160 mm×height 60 mm
 Si vapor supply source 54 (Si compound): TaSi$_2$ <Heating Process>
 The SiC substrate 10 arranged under the above conditions was subjected to heat treatment under the following conditions.
 Heating temperature: 1800° C.
 Heating time: 60 min
 Temperature gradient: 1° C./mm
 Growth rate: 68 nm/min
 Vacuum degree of main heating chamber 41: 10$^{-3}$ Pa FIG. 10 is a SEM image of the surface of the SiC substrate 10 before the growth of the SiC epitaxial layer 11. FIG. 10(*a*) is a SEM image observed at a magnification×1000, and FIG. 10(*b*) is a SEM image observed at a magnification×100000.

The MSB is formed on the surface of the SiC substrate 10 before the growth of the SiC epitaxial layer 11, and it can be grasped that steps having a height of 3 nm or higher are arranged with a terrace width of 42 nm on average. The step height was measured by AFM.

Figure 11:
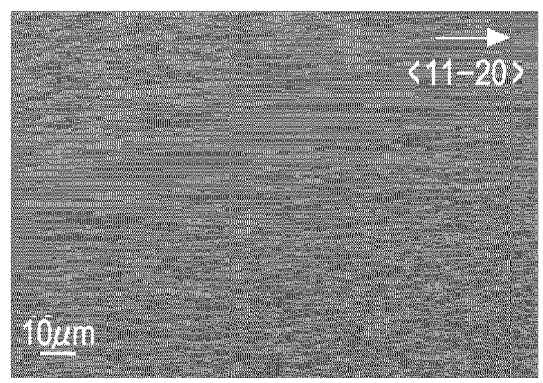
FIG. 11 is a SEM image of a surface of a SiC substrate observed after SiC epitaxial layer growth in the method for manufacturing a SiC epitaxial substrate according to the embodiment.
Figure 11:
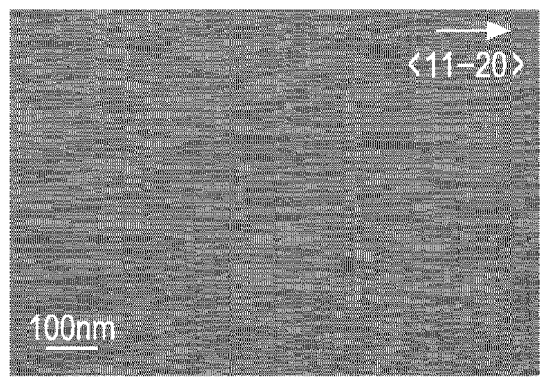

FIG. 11 is a SEM image of the surface of the SiC substrate 10 after the growth of the SiC epitaxial layer 11. FIG. 11(*a*) is a SEM image observed at a magnification×1000, and FIG. 11(*b*) is a SEM image observed at a magnification×100000.

It can be grasped that the MSB is not formed on the surface of the SiC epitaxial layer 11 of Example 2, and steps of 1.0 nm (full unit cell) are regularly arranged with a terrace width of 14 nm. The step height was measured by AFM.

Therefore, it can be grasped that, by arranging and heating the SiC substrate 10 having a surface with MSB in the semi-closed space in which the atomic number ratio Si/C is higher than 1, the SiC epitaxial layer 11 having the surface in which the MSB is decomposed is formed.

According to the present invention, the SiC substrate 10 is arranged and heated in the semi-closed space in which the atomic number ratio Si/C is higher than 1, so that the SiC epitaxial layer 11 functioning as a withstand voltage layer and having the surface in which the MAB is decomposed can be formed.

Figure 12:
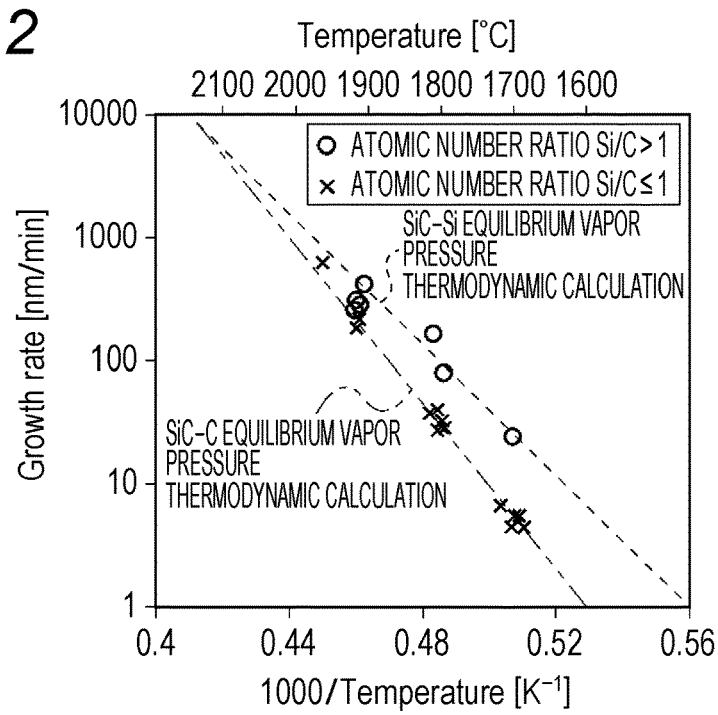
FIG. 12 is an Arrhenius plot illustrating a growth rate in the method for manufacturing the SiC epitaxial substrate according to the embodiment.

<Growth Rate of SiC Epitaxial Growth Layer>
 FIG. 12 is a graph showing a relationship between a heating temperature and a growth rate of a SiC epitaxial substrate grown by the method for manufacturing a SiC epitaxial substrate according to the present invention. The horizontal axis of this graph represents the reciprocal of the temperature, and the vertical axis of this graph represents the growth rate in logarithmic form. A result of growing the SiC epitaxial layer 11 on the SiC substrate 10 by arranging the SiC substrate 10 in a space where the atomic number ratio Si/C is higher than 1 (in the main container 30) is indicated by O. A result of growing the SiC epitaxial layer 11 on the SiC substrate 10 by arranging the SiC substrate 10 in a space where the atomic number ratio Si/C is lower than 1 (in the main container 30) is indicated by x.

In the graph of FIG. 12, the result of the thermodynamic calculation of the SiC substrate growth in the SiC—Si equilibrium vapor pressure environment is indicated by a broken line (Arrhenius plot), and the result of the thermodynamic calculation of the SiC substrate growth in the SiC—C equilibrium vapor pressure environment is indicated by a two-dot chain line (Arrhenius plot).

In this method, the SiC substrate 10 is grown using the chemical potential difference or the temperature gradient as the growth driving force under the condition that the vapor pressure environment between the SiC material and the SiC substrate becomes the SiC—C equilibrium vapor pressure environment or the SiC—C equilibrium vapor pressure environment. This chemical potential difference can be exemplified by a partial pressure difference of gaseous species generated on the surfaces of polycrystalline SiC (SiC material 20) and single crystal SiC (SiC substrate 10).

Here, when the partial pressure difference between the SiC material and the vapor generated from the SiC substrate is defined as the growth amount, the growth rate of SiC is obtained by the following Mathematical formula 1.

Growth rate $(m/s) \alpha$ [Mathematical formula 1]

$$\sum_{i=SiC,Si_2C,SiC_2} \frac{(P_{Raw\ material\ i} - P_{Substrate\ i})}{\sqrt{2\pi m_i kT}}$$

Here, T is a temperature on the SiC raw material side, $m_i$ is a molecular weight of a gaseous species ($Si_xC_y$), and k is a Boltzmann constant.

$P_{raw\ material} - P_{substrate}$ is a growth amount in which the source gas is supersaturated and precipitated as SiC, and SiC, Si$_2$C, and SiC$_2$ are assumed as the source gas.

That is, the broken line is a result of thermodynamic calculation when the single crystal SiC is grown using the polycrystalline SiC as a raw material in a vapor pressure environment when SiC (solid) and Si (liquid phase) are in a phase equilibrium state via a gas phase.

Specifically, using Mathematical formula 1, thermodynamic calculation was performed under the following conditions (i) to (iv). (i) The environment is a constant volume SiC—Si equilibrium vapor pressure environment, (ii) a growth driving force is a temperature gradient in the main container 30 and a vapor pressure difference (chemical potential difference) between the polycrystalline SiC and the single crystal SiC, (iii) a source gas is SiC, Si$_2$C, or SiC$_2$, and (iv) an adsorption coefficient at which the source is adsorbed to a step of the SiC substrate 10 is 0.001.

The two-dot chain line is a result of thermodynamic calculation when the single crystal SiC is grown using the polycrystalline SiC as a raw material in a vapor pressure environment when SiC (solid phase) and C (solid phase) are in a phase equilibrium state via a gas phase.

Specifically, using Mathematical formula 1, thermodynamic calculation was performed under the following conditions (i) to (iv). (i) The environment is a constant volume SiC—C equilibrium vapor pressure environment, (ii) a growth driving force is a temperature gradient in the main container 30 and a vapor pressure difference (chemical potential difference) between the polycrystalline SiC and the single crystal SiC, (iii) source gases are SiC, Si$_2$C, and SiC$_2$, and (iv) an adsorption coefficient at which the source is adsorbed to a step of the SiC substrate 10 is 0.001.

As the data of each chemical species used for the thermodynamic calculation, the values in the JANAF thermochemical table were adopted.

According to the graph of FIG. 12, it can be seen that the result (O) of growing the SiC epitaxial layer 11 on the SiC substrate 10 by arranging the SiC substrate 10 in the space (inside the main container 30) in which the atomic number ratio Si/C is higher than 1 is consistent with the result of the thermodynamic calculation of the SiC substrate growth in the SiC—Si equilibrium vapor pressure environment.

Also, it can be seen that the result (×) of growing the SiC epitaxial layer 11 on the SiC substrate 10 by arranging the SiC substrate 10 in the space (inside the main container 30) in which the atomic number ratio Si/C is equal to or lower than 1 is consistent with the result of the thermodynamic calculation of the SiC substrate growth in the SiC—C equilibrium vapor pressure environment.

Under the SiC—Si equilibrium vapor pressure environment, it is estimated to achieve a growth rate of equal to or higher than 1.0 µm/min at a heating temperature of 1960° C. In addition, it is estimated that a growth rate of equal to or higher than 2.0 µm/min is achieved at a heating temperature of equal to or higher than 2000° C.

Under the SiC—C equilibrium vapor pressure environment, it is estimated to achieve a growth rate of equal to or higher than 1.0 µm/min at a heating temperature of 2000° C. In addition, it is estimated that a growth rate of equal to or higher than 2.0 µm/min is achieved at a heating temperature of equal to or higher than 2030° C.

According to the present invention, the growth rate of the SiC epitaxial layer can be set to equal to or higher than 1.0 µ/min, and a withstand voltage layer can be grown at a high speed.

REFERENCE SIGNS LIST

10 SiC substrate
11 SiC epitaxial layer
20 SiC material
30 Main container
31 Substrate installation portion
40 Heating furnace
50 High melting point container
54 Si vapor supply source
S1 Raw material transport space

The invention claimed is:

1. A method for manufacturing a SiC epitaxial substrate, comprising:
an arranging process of arranging a SiC substrate in a main container and
a heating process of heating the SiC substrate and the main container;
wherein the SiC substrate contains dopants of any of nitrogen (N), phosphorus (P), aluminum (Al), and boron (B),
wherein the main container has an upper container and a lower container configured to be fitted to each other,
wherein at least one of the upper container and the lower container is made of a SiC material that contains the same dopant as the dopant of the SiC substrate,
wherein the SiC material has a lower doping concentration than the SiC substrate,
wherein the arranging process includes arranging the SiC material and the SiC substrate in a manner that they face each other, and arranging the upper container and the lower container in a manner that they are fitted to each other, and,
wherein the heating process includes heating such that a temperature gradient is formed such that the SiC material is on the high temperature side and the SiC substrate is on the low temperature side in a semi-closed space formed by the main container in which an atomic number ratio Si/C is lower than 1, whereby a vapor comprising Si element, C element, and the dopant sublimated from the SiC material is transported from the SiC material to the SiC substrate to form a SiC epitaxial layer on the SiC substrate, wherein the SiC epitaxial layer has a reduced basal plane dislocation density compared to the basal plane dislocation density of the SiC substrate.

2. The method for manufacturing a SiC epitaxial substrate according to claim 1, wherein the doping concentration of the SiC material is equal to or lower than $1 \times 10^{17}$ cm$^{-3}$.

3. The method for manufacturing a SiC epitaxial substrate according to claim 1, wherein the SiC substrate is arranged and heated in a semi-closed space in which an atomic number ratio Si/C is higher than 1 to planarize a surface of the SiC epitaxial layer, and
the semi-closed space is an internal space of the main container.

4. The method for manufacturing a SiC epitaxial substrate according to claim 1, wherein the SiC substrate is arranged and heated in a semi-closed space in which an atomic number ratio Si/C is equal to or lower than 1, and then the SiC substrate is arranged and heated the semi-closed space in which the atomic number ratio Si/C is higher than 1, thereby reducing a basal plane dislocation density in the SiC epitaxial layer, and
the semi-closed space is an internal space of the main container.

5. The method for manufacturing a SiC epitaxial substrate according to claim 1, wherein the SiC substrate is heated in a temperature range of equal to or higher than 1600° C.

6. The method for manufacturing a SiC epitaxial substrate according to claim 1, wherein the SiC epitaxial layer has a basal plane dislocation density of equal to or lower than 1.0 piece cm$^{-2}$.

* * * * *